United States Patent
Anderl et al.

(10) Patent No.: US 6,743,663 B1
(45) Date of Patent: Jun. 1, 2004

(54) METHOD FOR PRODUCING A HYBRID FRAME OR HYBRID HOUSING AND CORRESPONDING HYBRID FRAME OR HYBRID HOUSING

(76) Inventors: Jorg Anderl, Steinstrasse 25a, D-74889 Sinsheim (DE); Herbert Bender, Wollbachstrasse 13, D-74889 Sinsheim (DE); Winfried Lutte, 1, rue du Boesch, F-67510 Climbach (FR); Jurgen Vogel, Kürnbacher Strasse 12, D-75447 Sternenfels (DE); Norbert Voll, Ittlinger Strasse 1, D-74912 Kirchardt (DE)

( * ) Notice: Subject to any disclaimer, the term of this patent is extended or adjusted under 35 U.S.C. 154(b) by 0 days.

(21) Appl. No.: 09/786,809
(22) PCT Filed: Aug. 26, 1999
(86) PCT No.: PCT/EP99/06264
§ 371 (c)(1), (2), (4) Date: Jul. 30, 2001
(87) PCT Pub. No.: WO00/13875
PCT Pub. Date: Mar. 16, 2000

(30) Foreign Application Priority Data

Sep. 9, 1998 (DE) .......................................... 198 41 293
Sep. 19, 1998 (DE) .......................................... 198 43 076

(51) Int. Cl.$^7$ .................... H01L 21/44; H01L 21/48; H01L 21/50
(52) U.S. Cl. .................... 438/124; 257/787; 425/112; 264/266; 264/272.15; 264/275
(58) Field of Search .................... 438/123, 124, 438/127; 257/687, 787; 264/266, 275, 272.15; 425/112

(56) References Cited

U.S. PATENT DOCUMENTS

| 4,504,427 A | * | 3/1985 | Moyer ........................ 264/482 |
| 5,118,271 A | * | 6/1992 | Baird et al. ................. 425/116 |
| 5,359,761 A | * | 11/1994 | Whitson et al. .............. 29/883 |

FOREIGN PATENT DOCUMENTS

| EP | 642165 | * | 3/1995 |
| JP | 57 010955 | * | 5/1982 |

* cited by examiner

Primary Examiner—David A. Zarneke

(57) ABSTRACT

The invention relates to a method for producing a hybrid frame (1) or hybrid housing. According to said method, a leadframe (3) with soldering and/or bonding tags (3a), made from a plated strip, is placed into an injection mould and moulded with plastic in order to form a housing part (2) of the hybrid frame or the hybrid housing (1). According to the invention, the soldering and/or bonding tags (3a) of the leadframe (3) are kept in the injection moulding die at least during part of the injection-moulding process, by means of a plunger.

6 Claims, 1 Drawing Sheet

Figure 1:
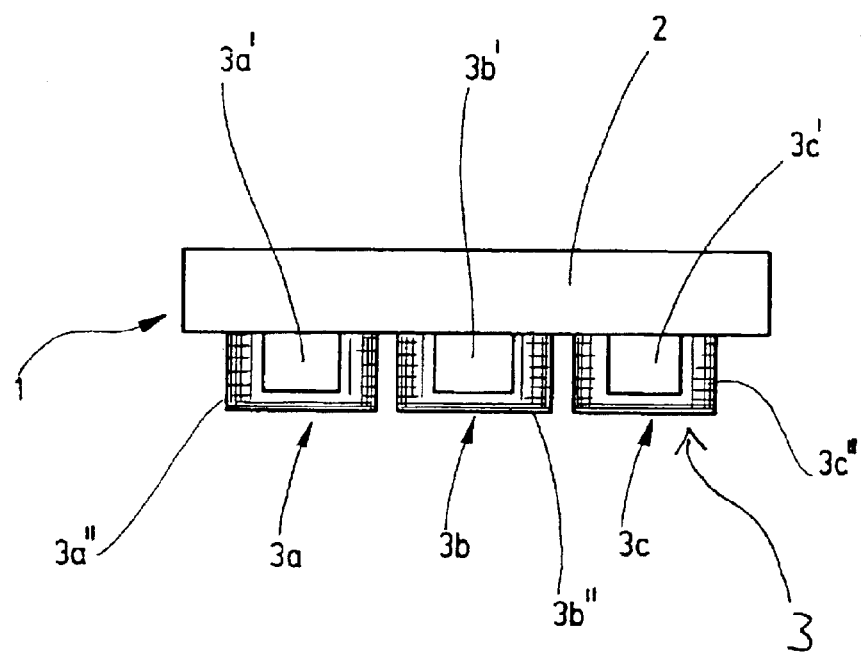

METHOD FOR PRODUCING A HYBRID FRAME OR HYBRID HOUSING AND CORRESPONDING HYBRID FRAME OR HYBRID HOUSING

DESCRIPTION

The invention relates to a method for producing a hybrid frame or hybrid housing, in which a leadframe with soldering and/or bonding tags, made from a plated strip, after being placed into an injection mould is moulded with plastic to form a housing part of the hybrid frame or the hybrid housing, and to such a hybrid frame or such a hybrid housing.

Such a method is known. This method has the disadvantage, that upon punching of the soldering and/or bonding tags of the leadframe a buckling due to punching occurs. This buckling due to punching can cause in a disadvantageous manner the buckling of the whole surface of the leadframe, so that there is no plane and regular surface especially of the soldering and/or bonding tags. A further disadvantage of the known method consists in that the soldering or bonding tags of the leadframe, which project from the plastic material after moulding, are not held during moulding, but that it is only provided that the injection mould is formed in a way, that the bonding tags cannot move in the plastic injection mould during the moulding process.

It is therefore the object of the invention to further develop a method of the kind mentioned at the beginning, that the quality of the leadframe before moulding has relatively little influence on the quality of the soldering and/or bonding tags of the hybrid frame or hybrid housing to be formed.

This object is achieved according to the invention, in that the soldering and/or bonding tags of the leadframe are held in the injection moulding die at least during a part of the injection moulding process by means of a stamp.

The method according to the invention distinguishes itself in that by the measures according to the invention the position of the individual soldering and/or bonding tags of the leadframe is well reproducible and can be dimensioned within close limits. The holding down of the individual bonding surfaces by the stamp during the moulding process brings forth in an advantageous manner, that surface defects of the leadframe are compensated. Furthermore, it is advantageous, that by the holding of the bonding tags during the moulding process, the vibrational behaviour of the bonding tags is influenced in a positive manner. The invention has the further advantage, that in this manner the bonding surfaces are protected from moulding influences during the moulding process. The holding down of the soldering and/or bonding tags of the leadframe during the moulding process has the advantage, that in this manner position tolerances in a direction perpendicular to the surface of the leadframe are compensated, so that a good reproducibility in this z-axis is given as well.

An advantageous variant of the invention provides that as a stamp a forming stamp is used. This measure according to the invention has the advantage, that the soldering and/or bonding surfaces of the soldering and/or bonding tags which are produced in this way are of a high quality, especially if a polished forming stamp is used. Additionally, it is achieved in this way, that in the section of form-stamping at all positions of the soldering and/or bonding tags the same soldering and/or bonding conditions are given, so that the soldering and/or bonding process is not critical for the applicant and can therefore be dimensioned within wider limits.

Further advantageous variants of the invention are subject of the dependent claims.

Further details and advantages are to be inferred from the embodiment, which is described in the following by the single figure. It is shown in:

FIG. 1 a schematic representation of a hybrid housing.

In FIG. 1 an embodiment of a hybrid housing 1 is shown, which is known and therefore not shown and described in detail, which is generally made up of a housing part 2, which is produced by moulding a leadframe in an injection mould, and of the bonding tags $3a$–$3c$ of the leadframe 3 projecting from the housing part 2. The bonding tags $3a$–$3c$ have a form-stamped section $3a''$–$3c''$, respectively, which is surrounded by a holding section $3a''$–$3c$.

The form-stamped section $3a'$–$3c'$ here is the section, on which during the moulding process in the injection moulding die a forming stamp not shown in the figure puts on in order to hold down the bonding tags $3a$–$3c$ during the moulding process.

It has to be stated here, that it is preferred, that the stamp holding down the bonding tags $3a$–$3c$ is made as a forming stamp, as in this manner the bonding tags $3a$–$3c$ are not only positioned and protected during the moulding process, but are at the same time form-stamped, so that this form-stamping process does not impose additional costs. It is preferred that here a forming stamp with a polished surface is used, which results in a bonding surface of a particularly high value and being particularly reproducible.

However, it has to be stressed, that for a multiplicity of applications it is sufficient, if the bonding tags are only held down by a corresponding stamp, i. e. that no form-stamping process occurs.

In the embodiment described above it is assumed, that it concerns a hybrid housing with bonding tags. But it is also possible to form a hybrid frame with bonding tags by the same method. It is also possible, that instead of the bonding tags soldering tags are formed.

It does not require any further explanation that the number of three bonding tags $3a$–$3c$ shown in the embodiment is only of exemplary character. It is of course possible to provide fewer or—what will occur more often in practice—more than three bonding tags.

What is claimed is:

1. A method for producing a hybrid frame or hybrid housing in which a leadframe having electrical connecting surfaces after being placed in an injection moulding die is moulded with plastic to form a housing part of the hybrid frame or the hybrid housing, characterized in that the electrical connection surfaces of the leadframe are held down in the injection moulding die for the compensation of surface defects at least during a part of the injection moulding process by means of a stamp.

2. The method according to claim 1, characterized in that the stamp is a forming stamp.

3. The method according to claim 2, characterized in that the electrical connecting surfaces are form-stamped during the moulding process.

4. A hybrid housing with a housing part (2) and bonding tags ($3a$–$3c$) of a leadframe (3) projecting from the housing part (2), characterized in that at least one of the soldering and/or bonding tags ($3a$–$3c$) has a form-stamping section ($3a'$–$3c'$) and a holding section ($3a''$–$3c''$) surrounding said form-stamping section ($3a'$–$3c'$).

5. A hybrid housing with a housing part and having electrical connecting surfaces of a leadframe projecting from the housing part, characterized in that at least least one of the electrical connecting surfaces has a first section, which can be acted upon by a stamp, and a second section surrounding said first section.

6. A hybrid frame, characterized in that at least one of the electrical connecting surfaces has a first section, which can be acted upon by a stamp, and a second section surrounding said first section.

* * * * *